United States Patent
Pucci et al.

(10) Patent No.: US 7,096,445 B1
(45) Date of Patent: Aug. 22, 2006

(54) NON-ORTHOGONAL STRUCTURES AND SPACE TILES FOR LAYOUT, PLACEMENT, AND ROUTING OF AN INTEGRATED CIRCUIT

(75) Inventors: Steven Lee Pucci, Los Gatos, CA (US); Eric Martin Nequist, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 573 days.

(21) Appl. No.: 10/342,863

(22) Filed: Jan. 14, 2003

(51) Int. Cl.
*G06F 17/50* (2006.01)

(52) U.S. Cl. .................. 716/8; 716/7; 716/12
(58) Field of Classification Search .......... 716/8, 716/7, 12, 9, 10, 13, 14
See application file for complete search history.

(56) References Cited

U.S. PATENT DOCUMENTS

| | | | | |
|---|---|---|---|---|
| 4,933,889 A * | 6/1990 | Meshkat et al. | ............. | 716/20 |
| 5,157,618 A | 10/1992 | Ravindra et al. | ............. | 716/16 |
| 5,550,748 A * | 8/1996 | Xiong | ............. | 716/13 |
| 5,617,322 A * | 4/1997 | Yokota | ............. | 700/98 |
| 5,689,433 A | 11/1997 | Edwards | ............. | 716/2 |
| 5,774,696 A * | 6/1998 | Akiyama | ............. | 716/20 |
| 5,822,214 A * | 10/1998 | Rostoker et al. | ............. | 716/10 |
| 5,911,061 A | 6/1999 | Tochio et al. | ............. | 703/23 |
| 6,035,108 A * | 3/2000 | Kikuchi | ............. | 716/2 |
| 6,128,767 A * | 10/2000 | Chapman | ............. | 716/1 |
| 6,166,441 A * | 12/2000 | Geryk | ............. | 257/773 |
| 6,230,306 B1 | 5/2001 | Raspopovic et al. | ............. | 716/13 |
| 6,247,853 B1 * | 6/2001 | Papadopoulou et al. | ....... | 716/4 |
| 6,253,363 B1 | 6/2001 | Gasanov et al. | ............. | 716/12 |
| 6,289,495 B1 | 9/2001 | Raspopovic et al. | ............. | 716/12 |
| 6,301,686 B1 * | 10/2001 | Kikuchi et al. | ............. | 716/2 |
| 6,317,864 B1 * | 11/2001 | Kikuchi et al. | ............. | 716/11 |
| 6,324,675 B1 | 11/2001 | Dutta et al. | ............. | 716/13 |
| 6,349,403 B1 | 2/2002 | Dutta et al. | ............. | 716/12 |
| 6,412,097 B1 * | 6/2002 | Kikuchi et al. | ............. | 716/2 |
| 6,484,305 B1 * | 11/2002 | Syo | ............. | 716/20 |
| 6,625,611 B1 | 9/2003 | Teig et al. | ............. | 707/102 |
| 6,668,365 B1 | 12/2003 | Harn | ............. | 716/10 |
| 6,680,150 B1 * | 1/2004 | Blatchford et al. | ............. | 430/5 |
| 6,701,306 B1 | 3/2004 | Kronmiller et al. | ............. | 707/2 |
| 6,785,874 B1 | 8/2004 | Tsukuda | ............. | 716/5 |
| 6,829,757 B1 * | 12/2004 | Teig et al. | ............. | 716/12 |
| 6,845,495 B1 | 1/2005 | Andreev et al. | ............. | 716/14 |

(Continued)

FOREIGN PATENT DOCUMENTS

JP 03127277 A * 5/1991

OTHER PUBLICATIONS

Bhattacharya et al., "Quadtree interconnection network layout", Proceedings of the Second Great Lake Symposium on VLSI, Feb. 28, 1992, pp. 74-81.*

(Continued)

*Primary Examiner*—Phallaka Kik
(74) *Attorney, Agent, or Firm*—Bingham McCutchen LLP

(57) ABSTRACT

Disclosed is an improved approach for maintaining the structures for objects in a layout. A single type of structure is maintained that can be used to store or track a polygon of any shape, as long as the shape possesses a supported number of sides. The structure is capable of supporting irregular polygons or objects having angled edges. In one approach, the structure maintains information about each polygon as if that polygon is an octagon. Therefore, any polygon having eight or less orthogonal or diagonal sides can be supported using this structure.

31 Claims, 15 Drawing Sheets

U.S. PATENT DOCUMENTS

| | | | |
|---|---|---|---|
| 6,948,146 B1* | 9/2005 | Allen et al. | 716/13 |
| 6,952,815 B1* | 10/2005 | Teig et al. | 716/14 |
| 6,957,410 B1* | 10/2005 | Teig et al. | 716/13 |
| 6,976,237 B1* | 12/2005 | Teig et al. | 716/13 |
| 2002/0059194 A1 | 5/2002 | Choi et al. | 707/3 |
| 2002/0157075 A1* | 10/2002 | Teig et al. | 716/10 |
| 2002/0166105 A1* | 11/2002 | Teig et al. | 716/14 |
| 2002/0170027 A1* | 11/2002 | Teig et al. | 716/10 |
| 2002/0174412 A1* | 11/2002 | Teig et al. | 716/12 |
| 2002/0199165 A1* | 12/2002 | Teig et al. | 716/14 |
| 2003/0005399 A1* | 1/2003 | Igarashi et al. | 716/8 |
| 2003/0023935 A1* | 1/2003 | McManus et al. | 716/1 |
| 2003/0066042 A1* | 4/2003 | Teig et al. | 716/13 |
| 2003/0070152 A1* | 4/2003 | Muller | 716/10 |
| 2003/0088841 A1* | 5/2003 | Teig et al. | 716/8 |
| 2003/0115566 A1* | 6/2003 | Teig | 716/14 |
| 2003/0121015 A1* | 6/2003 | Teig et al. | 716/7 |
| 2004/0044980 A1 | 3/2004 | Juengling | 716/17 |
| 2004/0139417 A1* | 7/2004 | Allen et al. | 716/19 |

OTHER PUBLICATIONS

Conway et al., "A New Template Based Approach to Module Generation", IEEE International Conference on Computer-Aided Design, Nov. 11, 1990, pp. 528-531.*

Ahuja, R.K. et al., eds., *Network Flows, Theory, Algorithms, and Applications* (1993) pp. 510-542, Prentice Hall, Upper Saddle River, NJ.

Al-Yamani, A. et al. "HPTS: Heterogeneous Parallel Tabu Search for VLSI Placement" *Proceedings of the 2002 Congress on Evolutionary Computation* (May 12-17, 2002), pp. 1:351-355.

Anderson, R. et al. "An O(n log n) Algorithm for 1-D Tile Compaction" *ICCAD-89—International Conference on Computer-Aided Design* (Nov. 5-9, 1989) pp. 144-147.

Balasa, F. et al. "Efficient Solution Space Exploration Based on Segment Trees in Analog Placement with Symmetry Constraints" in *IEEE/ACM International Conference on Computer Aided Design* (Nov. 10-14, 2002) pp. 497-502.

Barzaghi, M. et al. "Hierarchical Management of VLSI Cells at Different Description Levels" *Proceedings of the 6th Mediterranean Electrotechnical Conference* (May 22-24, 1991) pp.:327-330.

Benetis, R. et al. "Nearest Neighbor and Reverse Nearest Neighbor Queries for Moving Objects" *Proceedings of the International Database Engineering and Applications Symposium (IDEAS'02)* (Jul. 17-19, 2002) pp. 44-53.

Bern, J. et al. "Some Heuristics for Generating Tree-like FBDD Types" *IEEE Transactions on Computer-Aided Design of Integrated Circuits and Systems* (Jan. 1996), pp. 15(1):127-130.

Bhattacharya, S. and W.-T. Tsai "Area Efficient Binary Tree Layout" *1st Great Lakes Symposium on VLSI* (Mar. 1-2, 1991) pp. 18-24.

Blust, G. and D.P. Mehta "Corner Stitching for L-shaped Tiles" *Proceedings of the 3rd Great Lakes Symposium on VLSI, Design Automation of High Performance VLSI Systems* (Mar. 5-6, 1993), pp. 67-68.

Borah, M. et al. "An Edge-Based Heuristic for Steiner Routing" *IEEE Transactions on Computer-Aided Design of Integrated Circuits and Systems* (Dec. 1994), pp. 13(12):1563-1568.

Brück, R. and H. Wronn "-geoADDICTION—Flexible Handling of Geometries in IC-Layout Tools" *ISCAS '88—IEEE International Symposium on Circuits and Systems* (Jun. 7-9, 1988), pp. 1:723-726.

Cadence Design Systems, Inc. *IC Shape-Based Technology Chip Assembly User Guide* Product Version 11.0 (Nov. 2001), pp. 1-125.

Carlson, E.C. and R.A. Rutenbar "A Scanline Data Structure Processor for VLSI Geometry Checking" *IEEE Transactions on Computer-Aided Design* (Sep. 1987) 6(5):780-794.

Cheung, P. and J. Hesketh "Design Automation Tools for Tile-Based Analogue Cells" *IEE Colloquium on New Directions in VLSI Design* (Nov. 27, 1989) pp. 3/1-3/5.

Chiang, C. and C.-S. Chiang "Octilinear Steiner Tree Construction" *MWSCAS-2002—The 2002 45th Midwest Symposium on Circuits and Systems* (Aug. 4-7, 2002) pp. 1:603-606.

Christian, B.S. et al. "A VLSI Interval Router for High-Speed Networks" *Canadian Conference on Electrical and Computer Engineering* (May 26-29, 1996) pp. 1:154-157.

Cong, J. et al. "Multilevel Approach to Full-Chip Gridless Routing" *ICCAD 2001—IEEE/ACM International Conference on Computer-Aided Design* (Nov. 4-8, 2001) pp. 396-403.

Curatelli, F. et al. "Efficient Management of Complex Elements in Physical IC Design" *Proceedings of the IEEE International Symposium on Circuits and Systems* (May 1-3, 1990) 1:456-459.

Das, S. and B.B. Bhattacharya "Channel Routing in Manhattan-Diagonal Model" *Proceedings of the 9th International Conference on VLSI Design* (Jan. 3-6, 1996) pp. 43-48.

Dasgupta, P. et al. "Multiobjective Search in VLSI Design" *Proceedings of the 7th International Conference on VLSI Design* (Jan. 1994) pp. 395-400.

Dasgupta, P. et al. "Searching Networks With Unrestricted Edge Costs" *IEEE Transactions on Systems, Man and Cybernetics-Part A: Systems and Humans* (Nov. 2001) 31(6):497-507.

Dijkstra, E.W. "A Note on Two Problems in Connexion with Graphs" *Numerische Mathematik* (1959) 1:269-271.

de Dood, P. et al. "A Two-Dimensional Topological Compactor With Octagonal Geometry" *28th ACM/IEEE Automation Conference* (1991) pp. 727-731.

Doong, K. Y.-Y. et al. "Infrastructure Development and Integration of Electrical-Based Dimensional Process Window Checking" *IEEE Transactions on Semiconductor Manufacturing* (May 2004) 17(2):123-141.

Dutt, S. "New Faster Kernighan-Lin-Type Graph-Partitioning Algorithms" *ICCAD-93—1993 IEEE/ACM International Conference on Computer-Aided Design* (Nov. 7-11, 1993) pp. 370-377.

Façanha, H.S. et al. "Layout Tool for High Speed Electronic and Optical Circuits" *IEE Colloquium on Analogue IC Design: Obstacles and Opportunities* (Jun. 18, 1990) pp. 3/1-3/5.

Façanha, H.S. et al. "Data structures for physical representation of VLSI" *Software Engineering Journal* (Nov. 1990) 5(6):339-349.

Fang, J.P. and S.J. Chen "Tile-Graph-Based Power Planning" *ISCAS'03—Proceedings of the 2003 International Symposium on Circuits and Systems* (May 25-28, 2003) 5:V-501-V-504.

Faroe, O. et al. "Local Search for Final Placement in VLSI Design" *ICCAD 2001—IEEE/ACM International Conference on Computer-Aided Design* (Nov. 4-8, 2001) pp. 565-572.

Gannett, J.W. "Shortfinder: A Graphical CAD Tool for Locating Net-to-Net Shorts in VLSI Chip Layouts" *IEEE Transactions on Computer-Aided Design* (Jun. 1990) 9(6):669-674.

Grgek, M. et al. "Performance Comparison of Several Data Structures for Storing VLSI Geometry" *The IEEE Region 8 EUROCON 2003, Computer as a Tool* (Sep. 22-24, 2003) 1:156-159.

Guibas, L.J. and J. Stolfi "On Computing All North-East Nearest Neighbors in the $L_1$ Metric" *Information Processing Letters* (Nov. 8, 1983) pp. 219-223, vol. 17, No. 4.

Hettiaratchi, S. and P.Y.K. Cheung "A novel implementation of tile-based address mapping" *DATE'04—Proceedings of the Design, Automation and Test in Europe Conference and Exhibition* (Feb. 16-20, 2004) 1:306-310.

Hsiao, P.-Y. and W.-S. Feng "Using a Multiple Storage Quad Tree on a Hierarchical VlSI Compaction Scheme" *IEEE Transactions on Computer-Aided Design* (May 1990) 9(5):522-536.

Hsiao, P.-Y. et al. "Optimal tile partition for space region of integrated circuits geometry" *IEEE Proceedings-E* (May, 1993) 140(3):145-153.

Hur, S.-W. and J. Lillas "Relaxation and Clustering in a Local Search Framework: Application to Linear Placement" *Proceedings of the 36h Design Automation Conference* (Jun. 21-25, 1999) pp. 360-366.

Hwang, F.K. "An O(n log n) Algorithm for Rectilinear Minimal Spanning Trees" *J. ACM* (Apr. 1979) 26(2):177-182.

Iwasaki, H. et al. "An Effective Data Structure for VLSI Layout Systems" *Proceedings of the IEEE International Symposium on Circuits and Systems* (Jun. 11-14, 1991) 5:3134-3137.

Johann, M. and R. Reis "Net by Net Routing with a New Path Search Algorithm" *Proceedings of the 13th Symposium on Integrated Circuits and Systems Design* (Sep. 18-24, 2000) pp. 144-149.

Kiyota, K. and K. Fujiyoshi "Simulated Annealing Search Through General Structure Floorplans Using Sequence-Pair" *ISCAS 2000—Proceedings of the 2000 IEEE International Symposium on Circuits and Systems*, Geneva, Switzerland (May 28-31, 2000) 3:77-80.

Koh, C.-K. and P.H. Madden "Manhattan or Non-Manhattan? A Study of Alternative VLSI Routing Architectures" *Proceedings of the 10th Great Lakes Symposium on VLSI* (Mar. 2000) pp. 47-52.

Kruskal, Jr., J.B. "On the Shortest Spanning Subtree of a Graph and the Traveling Salesman Problem" *Proc. Amer. Math. Soc.* (1956) pp. 48-50.

Ku, L.-P. and H.W. Leong "Note on optimal tile partition for space region of integrated-circuit geometry" *IEE Proceedings on Computers and Digital Techniques* (Jul. 1996) 143(4):246-248.

Kubo, Y. et al. "Self-Reforming Routing for Stochastic Search in VLSI Interconnection Layout" *Proceedings of the ASP-DAC 2000 Asia South Pacific Design Automation Conference* (Jan. 25-28, 2000) pp. 87-92.

Kuh, E.S. and T. Ohtsuki "Recent Advances in VLSI Layout" *Proceedings of the IEEE* (Feb. 1990) 78(2):237-263.

Kunii, T.L. et al. "Hierarchic Shape Description via Singularity and Multiscaling" *COMPSAC 94—Proceedings of the 18th Annual International Computer Software and Applications Conference* (Nov. 9-11, 1994) pp. 242-251.

Lai, G.G. et al. "Hinted Quad Trees for VLSI Geometry DRC Based on Efficient Searching for Neighbors" *IEEE Transactions on Computer-Aided Design of Integrated Circuits and Systems* (Mar. 1996) 15(3):317-324.

Lai, Y.-K. et al. "An Efficient Array Architecture with Data-Rings for 3-Step Hierarchical Search Block Matching Algorithm" *1997 IEEE International Symposium on Circuits and Systems*, Hong Kong (Jun. 9-12, 1997) 2:1361-1364.

Liao, S. et al. "An Efficient External-Memory Implementation of Region Query with Application to Area Routing" *(ICCD'02)—Proceedings of the 2002 IEEE International Conference on Computer Design: VLSI in Computers and Processors* (Sep. 16-18, 2002) pp. 36-41.

Lin, Y.-L. et al. "Routing Using a Pyramid Data Structure" *ICCAD-89—1989 International Conference on Computer-Aided Design* (Nov. 5-9, 1989) pp. 436-439.

Lin. Y.-L. et al. "Hybrid Routing" *IEEE Transactions on Computer-Aided Design* (Feb. 1990) 9(2):151-157.

Linhares, A. "Synthesizing a Predatory Search Strategy for VLSI Layouts" *IEEE Transactions on Evolutionary Computation* (Jul. 1999) 3(2):147-152.

Lodha, S.K. and D. Bhatia "Bipartitioning Cirucits using TABU Search" *Proceedings of the 11th Annual IEEE International ASIC Conference* (Sep. 13-16, 1998) pp. 223-227.

Luk, W.K. and A.A. Dean "Multistack Optimization for Data-Path Chip Layout" *IEEE Transactions on Computer-Aided Design* (Jan. 1991) 10(1):116-129.

Margarino, A. et al. "A Tile-Expansion Router" *IEEE Transactions on Computer-Aided Design* (Jul. 1987) 6(4):507-517.

Marple, D. et al. "Tailor: A Layout System Based on Trapezoidal Corner Stitching" *IEEE Transactions on Computer-Aided Design* (Jan. 1990) 9(1):66-90.

Mehta, D. and G. Blust "Corner Stitching for Simple Rectilinear Shapes" *IEEE Transactions on Computer-Aided Design of Integrated Circuits and Systems* (Feb. 1997) 16(2):186-198.

van der Meijs, N.P. and A.J. van Genderen "Space-Efficient Extraction Algorithms" *Proceedings of the 3rd European Conference on Design Automation* (Mar. 16-19, 1992) pp. 520-524.

van der Meijs, N.A. and A.J. van Genderen "An Efficient Algorithm for Analysis of Non-Orthogonal Layout" *ISCAS '89—IEEE International Symposium on Circuits and Systems* (May 8-11, 1989) 1:47-52.

Modarres, H, and R.J. Lomax "A Formal Approach to Design-Rule Checking" *IEEE Transactions on Computer-Aided Design* (Jul. 1987) 6(4):561-573.

Nakatake, S. et al. "Consistent Floorplanning with Hierarchical Superconstraints" *IEEE Transactions on Computer-Aided Design of Integrated Circuits and Systems* (Jan. 2002) 21(1):42-49.

Öten, R. and R. J.P. de Figueiredo "Topological Dimensionality Determination and Dimensionality Reduction Based on Minimum Spanning Trees" *ISCAS '98—Proceedings of the 1998 IEEE International Symposium on Circuits and Systems* (May 31-Jun. 3, 1998) 3:366-369.

Pitaksanonkul, A. et al. "Comparisons of Quad Trees and 4-D Trees: New Results" *IEEE Transactions on Computer-Aided Design* (Nov. 1989) 8(11):1157-1164.

Powers, K.D. et al. "The 60° Grid: Routing Channels in Width $d/\sqrt{3}$" *Proceedings of the 1st Great Lakes Symposium on VLSI* (Mar. 1-2, 1991) pp. 214-219.

Preparata, F.P. and M.I. Shamos, *Computational Geometry An Introduction* (1985) Springer-Verlag New York Inc., 401 pages.

Prim, R.C. "Shortest Connection Networks and Some Generalizations" *The Bell System Technical Journal* (Nov. 1957) 36(6):1389-1401.

Rothermel, H.-J. and D.A. Mlynski "Automatic Variable-Width Routing for VLSI" *IEEE Transactions on Computer-Aided Design* (Oct. 1983) 2(4):271-284.

Sait, S.M. et al. "Performance and Low Power Driven VLSI Standard Cell Placement using Tabu Search" *CED '02—Proceedings of the 2002 Congress on Evolutionary Computation* (May 12-17, 2002) 1:372-377.

Sakanushi, K. and Y. Kajitani "The Quarter-State Sequence (Q-sequence) to Represent the Floorplan and Applications to Layout Optimization" *IEEE APCCAS 2000—The 2000 IEEE Asia-Pacific Conference on Circuits and Systems* (Dec. 4-6, 2000) pp. 829-832.

Salek, A.H. et al. "Hierarchical Buffered Routing Tree Generation" *IEEE Transactions on Computer-Aided Design of Integrated Circuits and Systems* (May 2002) 21(5):554-567.

Sarrafzadeh, M. et al. "Single-Layer Global Routing" *IEEE Transactions on Computer-Aided Design of Integrated Circuits and Systems* (Jan. 1994) 13(1):38-47.

Schmiedle, F. et al. "Exact Routing with Search Space Reduction" *IEEE Transactions on Computers* (Jun. 2003) 52(6):815-825.

Séquin, C.H. and H. da Silva Façanha "Corner-Stitched Tiles with Curved Boundaries" *IEEE Transactions on Computer-Aided Design of Integrated Circuits and Systems* (Jan. 1993) 12(1):47-58.

Serdar, T. and C. Sechen "Automatic Datapath Tile Placement and Routing" *Conference and Exhibition on Design, Automation and Test in Europe* (Mar. 13-16, 2001) pp. 552-559.

Sim, S.-P. et al. "Analytical Capacitance Model for High-Speed Interconnects with Diagonal Routing" *Proceedings of the IEEE 2002 International Interconnect Technology Conference* (Jun. 3-5, 2002) pp. 157-158.

Su, S.J. and Y.S. Kuo "Multicell Quad Trees" *Proceedings of the 3rd European Conference on Design Automation* (Mar. 16-19, 1992) pp. 147-151.

Sun, P.K. "An Octagonal Geometry Compactor" *Proceedings of the 1998 IEEE International Conference on Computer Design: VLSI in Computers and Processors—ICCD '88* (Oct. 3-5, 1988) pp. 190-193.

Suzuki, G. et al. "MOSAIC: A Tile-Based Datapath Layout Generator" *ICCAD-92—1992 IEEE/ACM International Conference on Computer-Aided Design* (Nov. 8-12, 1992) pp. 166-170.

Tan, X. and X. Song "Improvement on the diagonal routing model" *IEE Proceedings on Circuits, Devices and Systems* (Dec. 1994) 141(6):535-536.

Tarjan, R.E., ed. *Data Structures and Network Algorithms* Society for Industrial and Applied Mathematics, Philadelphia, PA (1983) pp. 71-83.

Tsai, C.-C. et al. "An H-V Alternating Router" *IEEE Transactions on Computer-Aided Design* (Aug. 1992) 11(8):976-991.

Tseng, H.-P. and C. Sechen "A Gridless Multi-Layer Router for Standard Cell Circuits using CTM Cells" *ED&TC 97—Proceedings of the European Design and Test Conference* (Mar. 17-20, 1997) pp. 319-326.

Tseng, H.-P. and C. Sechen "A Gridless Multilayer Router for Standard Cell Circuits Using CTM Cells" *IEEE Transactions on Computer-Aided Design of Integrated Circuits and Systems* (Oct. 1999) 18(10):1462-1479.

Tzionas, P.G. et al. "A New, Cellular Automaton-Based, Nearest Neighbor Pattern Classifier and Its VLSI Implementation" *IEEE Transactions on Very Large Scale Integration (VLSI) Systems* (Sep. 1994) 2(3):343-353.

Wu, G.-M. et al. "Rectilinear Block Placement Using B*-Trees" *Proceedings of the International Conference on Computer Design* (Sep. 17, 2000) pp. 351-356.

Xing, Z. and R. Kao "Shortest Path Search Using Tiles and Piecewise Linear Cost Propagation" *IEEE Transactions on Computer-Aided Design of Integrated Circuits and Systems* (Feb. 2002) 21(2):145-158.

Xu, N. et al. "TSCSP: Tabu Search Algorithm for VLSI Module Placement Based on the Clustering Sequence-Pair" *5th International Conference on ASIC* (Oct. 21-24, 2003) 1:306-310.

Yamazaki, H. et al. "Optimum Packing of Convex-Polygons by a New Data Structure Sequence-Table" *IEEE APCCAS 2000—The 2000 IEEE Asia-Pacific Conference on Circuits and Systems* (Dec. 4-6, 2000) pp. 821-824.

Yan, Z. et al. "Area Routing Oriented Hierarchical Corner Stitching with Partial Bin" *Proceedings of the ASP-DAC 2000 Asia-South Pacific Design Automation Conference* (Jan. 25-28, 2000) pp. 105-110.

Yu, Z. et al. "Layout-based 3D Solid Modeling for IC" *Proceedings of the 1995 International Symposium on VLSI Technology, Systems and Applications* (May 31-Jun. 2, 1995) pp. 108-112.

Zhang, Y. et al. "A Gridless Router Based on Hierarchical PB Corner Stitching Structure" *IEEE 2002 International Conference on Communications, Circuits and Systems and West Sino Expositions* (Jun. 29-Jul. 1, 2002) 2:1438-1443.

Zheng, S.-Q. et al. "Efficient Maze-Running and Line-Search Algorithms for VLSI Layout" *Proceedings of the IEEE Southeastcon '93* (Apr. 4-7, 1993) 8 pages.

Zheng, S.Q. et al. "Finding Obstacle-Avoiding Shortest Paths Using Implicit Connection Graphs" *IEEE Transactions on Computer-Aided Design of Integrated Circuits and Systems* (Jan. 1996) 15(1):103-110.

Zheng, S.Q. et al. "Routing Using Implicit Connection Graphs" *9th International Conference on VLSI Design* (Jan. 3-6, 1996) pp. 49-52.

Brenner, U. et al. "An Effective Congestion Driven Placement Framework" *Proceedings of the 2002 International Symposium on Physical Design*, San Diego, CA (Apr. 7-11, 2002) pp. 6-11.

Hu, J. et al. "A Survey on Multi-net Global Routing for Integrated Circuits" (1998), pp. 1-68, located at http://www.ece.umn.edu/users/sachin/PUBS/integration01.pdf.

Sarkar, P. et al. "Routability-Driven Repeater Block Planning Interconnect-Centric Floorplanning" *Proceedings of the International Symposium on Physical Design* (Apr. 2000), pp. 1-29.

* cited by examiner

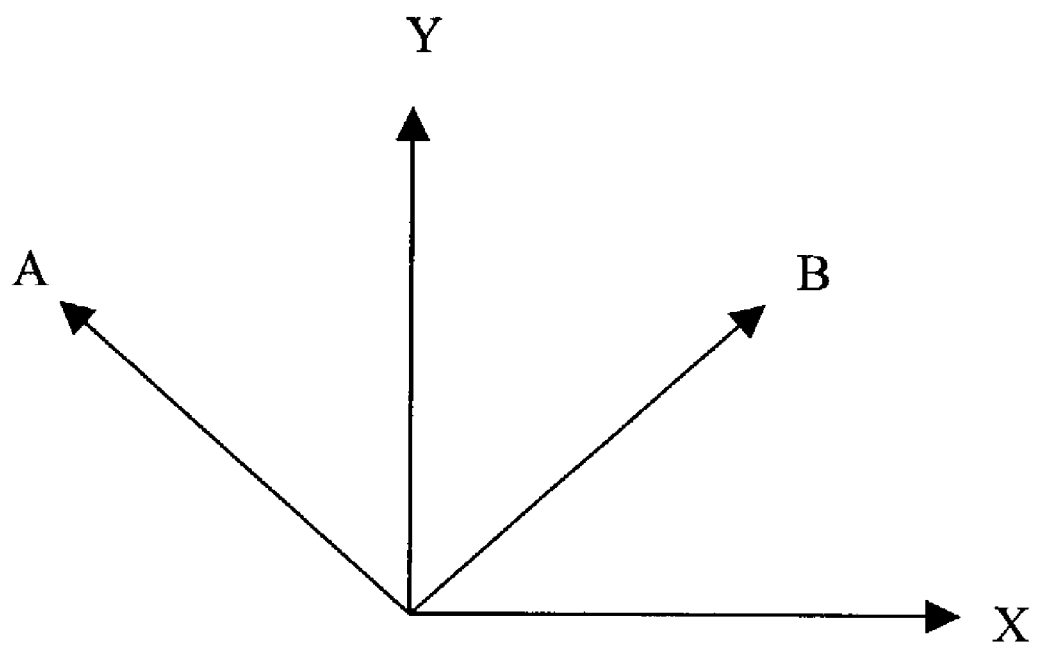

NON-ORTHOGONAL STRUCTURES AND SPACE TILES FOR LAYOUT, PLACEMENT, AND ROUTING OF AN INTEGRATED CIRCUIT

BACKGROUND

A semiconductor integrated circuit (IC) has a large number of electronic components, such as transistors, logic gates, diodes, wires, etc., that are fabricated by forming layers of different materials and of different geometric shapes or polygons on various regions of a silicon wafer. The design of an integrated circuit transforms a circuit description into a geometric description called a layout. The process of converting specifications of an integrated circuit into a layout is called the physical design.

Geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. Since modern IC designs often contain an extremely large number of such components, electronic design automation ("EDA") tools and software are normally used by designers to facilitate and perform the place and route process.

A layout may contain a number of different types and configurations of shapes, e.g., polygonal shapes such as triangles, rectangles, etc. In one approach for implementing EDA tools, a separate data structure may be employed to store and maintain each different type of polygon in the layout. For instance, for each triangular-shaped polygon in the layout, a triangle-based data structure may be used to track those objects. For each rectangular-shaped polygon, a rectangle-based data structure may be used to track these objects. The advantage of this approach is that the dedicated data structure for each polygon type can be optimized for the exact set of information required to track its associated objects.

However, drawbacks also exist for this approach. A significant drawback is that the proliferation of different data structures also requires a corresponding increase in the complexity and size of the EDA tool that operates upon the data structures. The EDA tool normally includes a set of functions or operations that operate upon the polygons in the layout. Each operation supported by the EDA tool should support the different shapes and combinations of shapes in the layout. If there are a number of different data structures corresponding to the different available shapes, then the EDA tool must be configured to operate upon those different data structures. This increases the complexity and cost of creating and maintaining the EDA tool.

SUMMARY

The present invention provides an improved approach for maintaining the structures for objects in a layout. A single type of structure is maintained that can be used to store or track a polygon of any shape, as long as the shape possesses a supported number of sides. The structure is capable of supporting irregular polygons or objects having angled edges. In one embodiment, the structure maintains information about each polygon as if that polygon is an octagon. Therefore, any polygon having eight or less orthogonal or diagonal sides can be supported using this structure.

Other and additional objects, features, and advantages of the invention are described in the detailed description, figures, and claims.

BRIEF DESCRIPTION OF DRAWINGS

FIG. 1 is depicts an approach for defining axes for a structure for storing and tracking polygons according to an embodiment of the invention.

DETAILED DESCRIPTION

The present invention provides an improved approach for maintaining the structures for objects in a layout. For the purpose of explanation these objects are referred to in this document as "polygons," regardless of the exact shape of the respective objects. In one embodiment, a single type of structure is maintained that can be used to store or track a polygon of any shape, as long as the shape possesses a supported number of sides. The structure is capable of supporting irregular polygons or objects having angled edges.

In one embodiment, the structure maintains information about each polygon as if that polygon is an octagon. Therefore, any polygon having eight or less orthogonal or diagonal sides can be supported using this structure. For this structure, there is a set of two axes offset at an angle from X and Y, which are referred to as A and B. For the purposes of exposition, the following explanation is described with reference to axes A and B set at 45 degrees offset from X and Y. However, it is noted that alternate embodiments may employ other angles and axes, and thus the exact angles illustrated herein are not limiting as to the scope of the invention except as specified in the claims.

A increases in the northwest direction and B increases in the northeast direction, as shown in FIG. 1. One approach for defining A and B is as follows:

$$A = Y - X$$

$$B = Y + X$$

Defining the axes in this manner allows one to associate a single number (the "bound") with each edge of the octagon structure for an object.

Figure 2A:
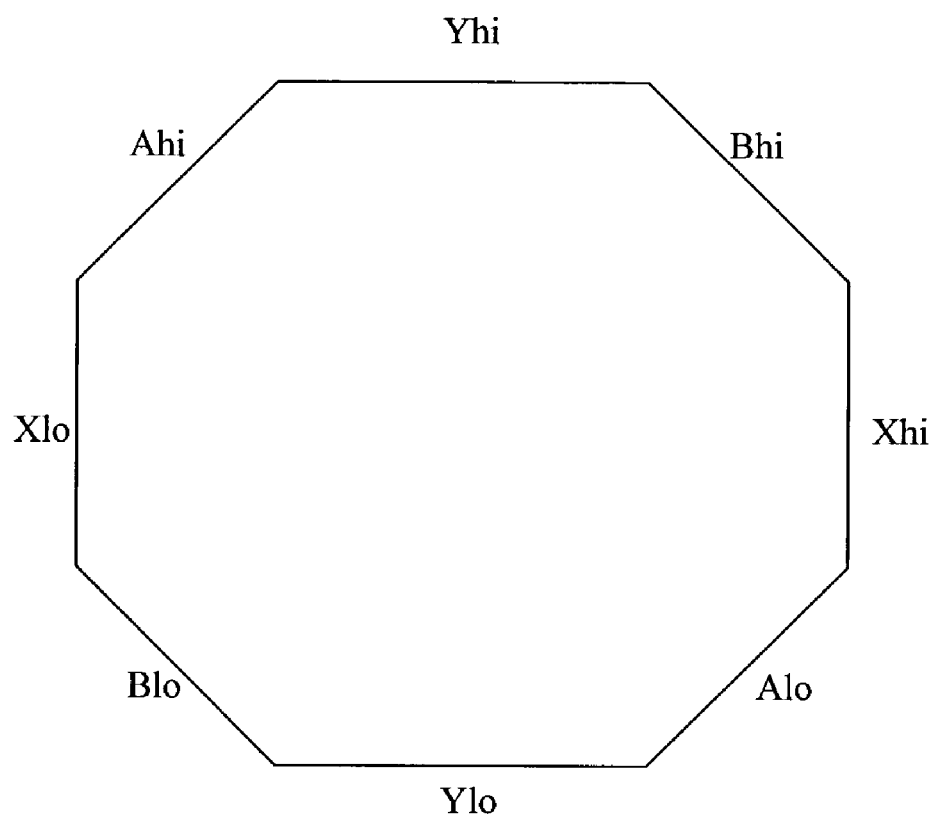
FIGS. 2*a* and 2*b* show an octagonal structure for storing and tracking polygons according to an embodiment of the invention.
Figure 2B:
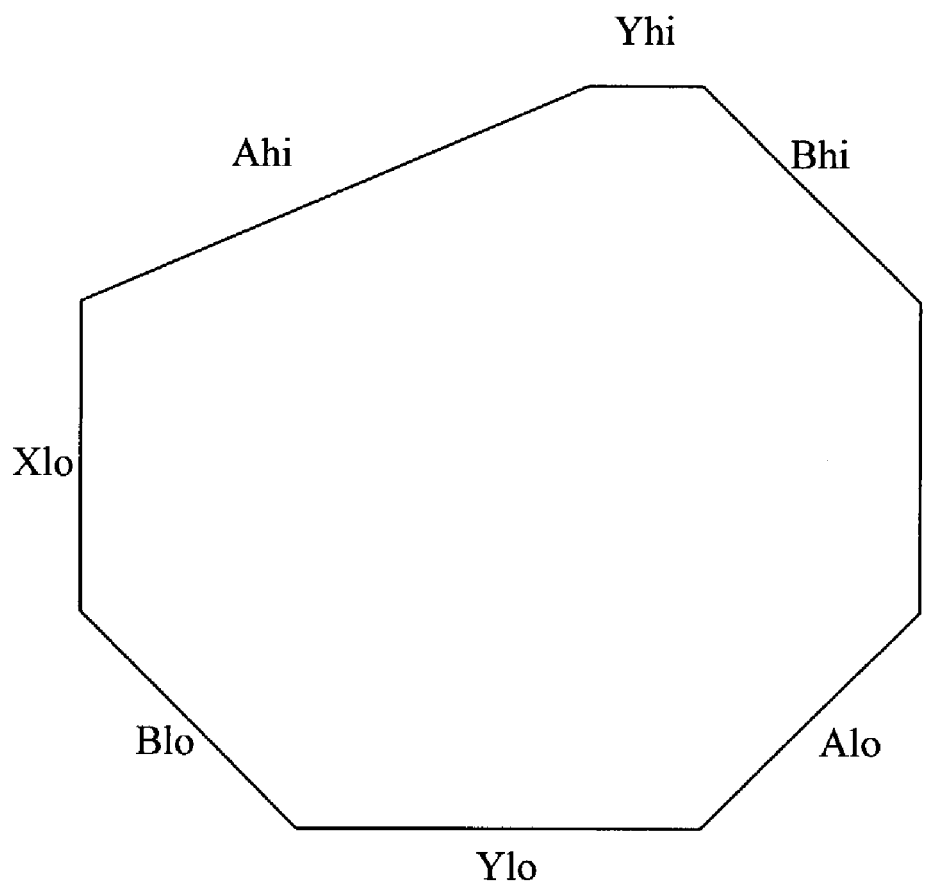

Referring to FIG. 2*a*, the result is that eight independent values can be used to define an octagon structure. Each independent value corresponds to a side of the octagon structure. Given bounds xlo, ylo, xhi, yhi, alo, blo, ahi, and bhi, these values define the exact structure of an octagonal shape. In one embodiment, the data value that is stored for the bound is the location of that side along the axis perpendicular to that side. Thus, for the north (top) side of an octagon the y value of that side (yhi) is stored. The length of each side can be extracted from this data. Information can be maintained to identify the angle of each side. If the structure implies a default angle for each of the angles sides, e.g., a 45 degree angle is implied for each angled side, then explicit angle information does not have to be maintained. FIG. 2b shows an example octagonal structure in which the edge associated with bound ahi has an angle that differs from the 45 degree angle of the other diagonal edges. In this example, a data element would be associated with bound ahi to identify the specific angle for its associated edge.

Figure 3:
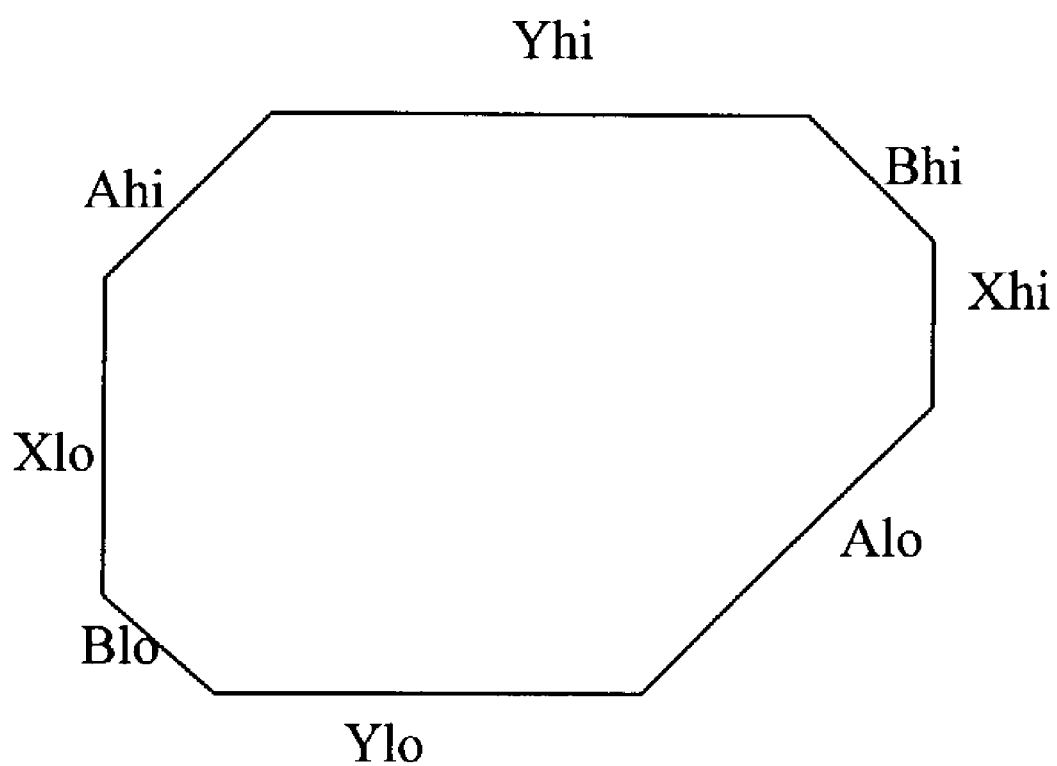
FIGS. 3–6 show examples of polygonal shapes represented by an octagonal data structure according to an embodiment of the invention.

As shown in FIG. 3, the value of the bound of any of the sides for the octagonal structure can be varied to store the exact octagonal configuration of a stored shape, even an irregular octagon.

Any polygon (having up to eight sides) can be represented using an octagonal structure according to the present embodiment, even polygons having less than eight sides. This is accomplished by varying any of the independent bounds to capture the intended shape of an object. If the shape has less than eight sides, then one or more of the independent values for the octagonal structure is represented as having a zero length side. In this manner, a polygon having less than eight sides can still be represented by the octagonal structure—albeit a degenerate octagon. This highlights a significant advantage of the present embodiment of the invention. Since all shapes are represented by the same structure, regardless of the exact shape being represented, any set of operations or functions intended to operate upon those shapes only need to be configured to work with the octagonal structure. This is in contrast to alternate approaches involving multiple data structure formats for different shapes, in which multiple sets or configurations of operations/functions would be required to operate upon a set of non-homogeneous shapes.

Figure 4:
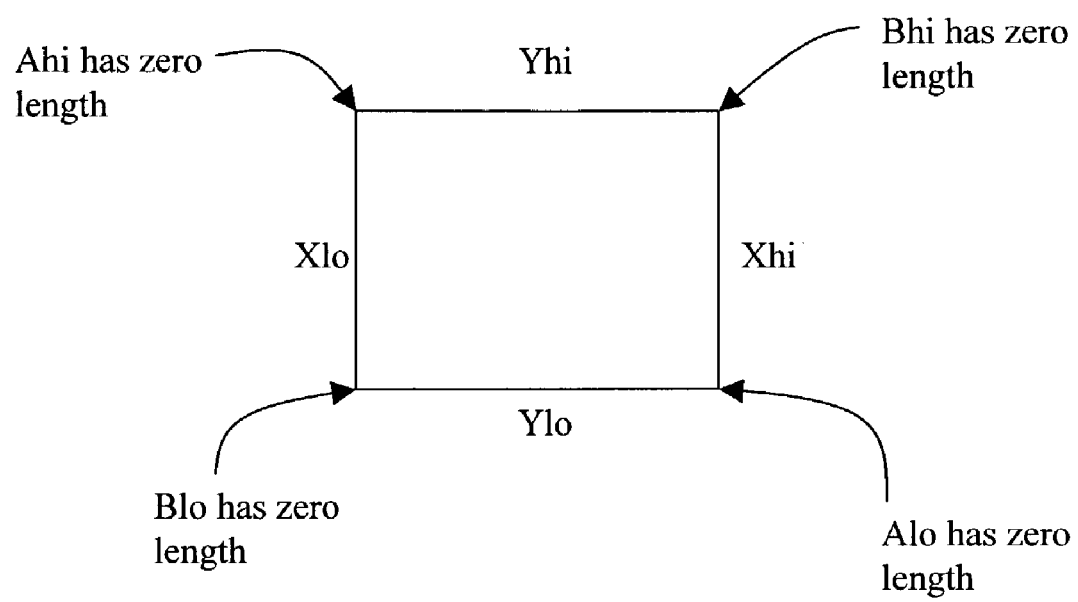

FIG. 4 shows a rectangular polygon represented using the present octagon structure. In this example, the rectangle is actually represented as a degenerate octagon, in which only four sides xlo, ylo, xhi, and yhi have non-zero lengths. Sides ahi, bhi, blo, and alo have zero lengths.

Figure 5:
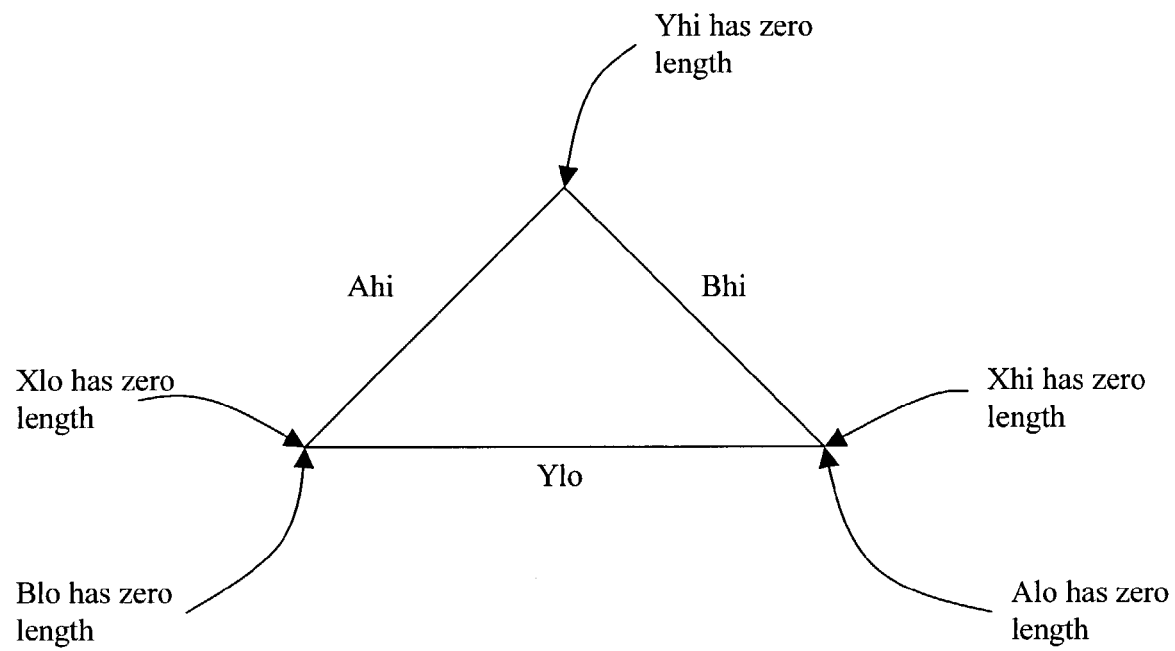

FIG. 5 shows a triangular polygon represented using the present octagon structure. In this example, the triangle is also represented as a degenerate octagon, in which only three sides ahi, bhi, and ylo have non-zero lengths. Sides xlo, blo, yhi, xhi, and alo have zero lengths.

Figure 6:
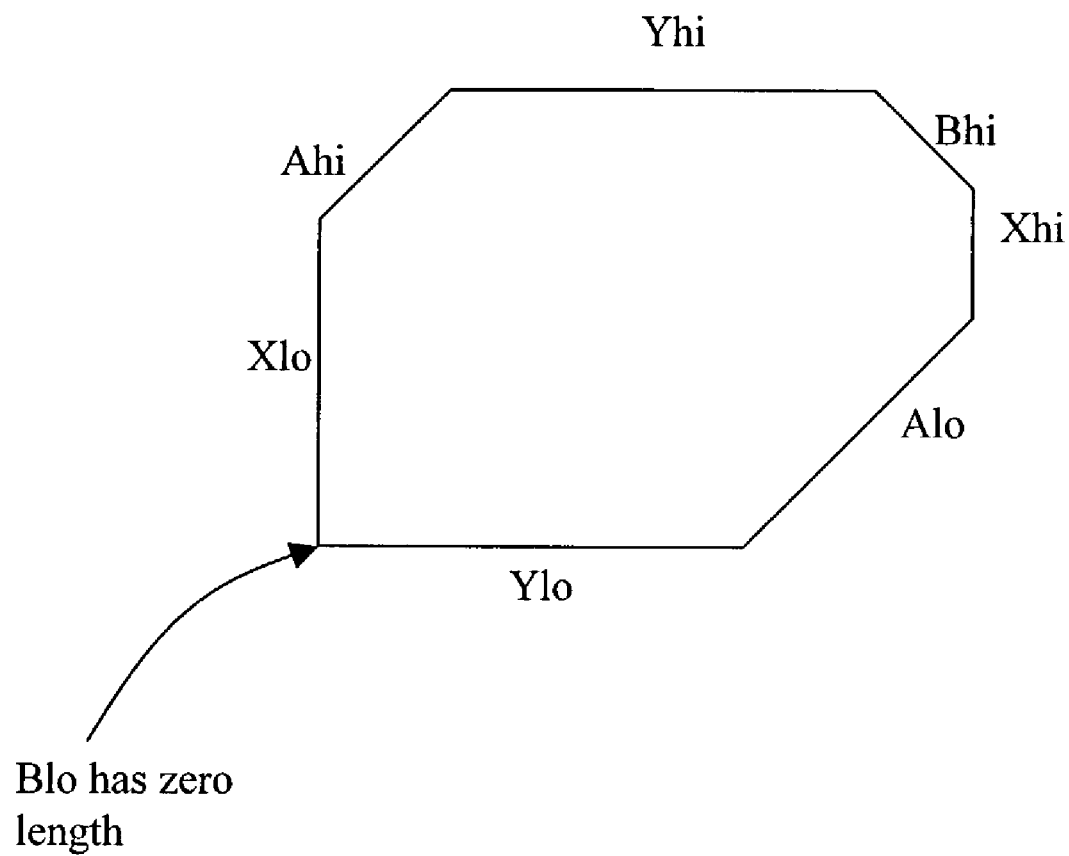

FIG. 6 shows an irregular heptagon shape represented using the present octagon structure. In this example, the corresponding octagon structure for the non-regular heptagon has seven sides xlo, ahi, yhi, bhi, xhi, alo, and ylo with non-zero lengths. Side blo has a zero lengths.

Figure 7:
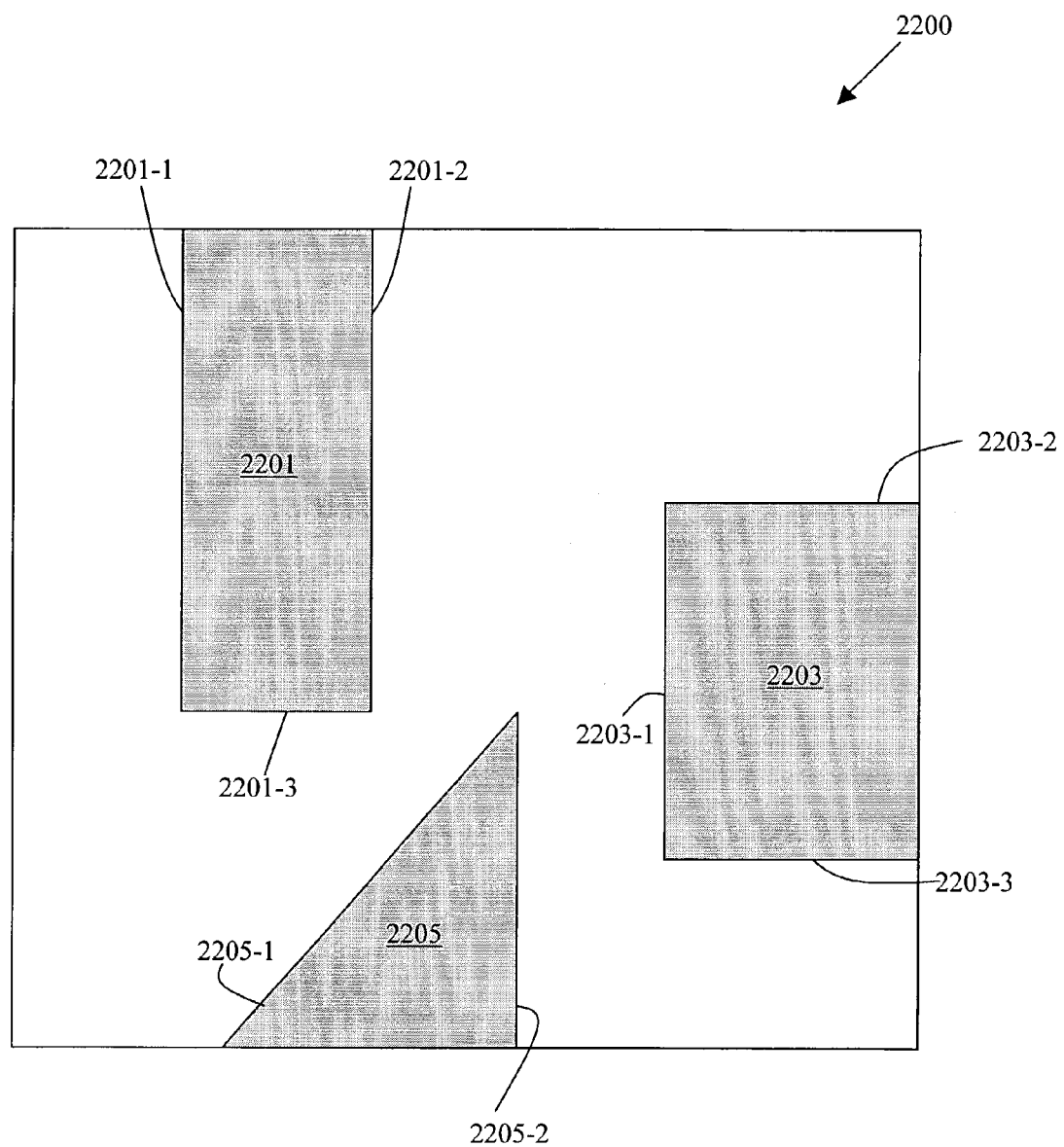
FIG. 7 shows an example window.

Using the present approach, every polygon on the layout having the supported number of sides, i.e., eights sides or less, can be represented as octagonal structures. Referring to FIG. 7, shown is a window 2200 containing three polygons. Polygon 2201 has a rectangular shape, and can therefore be represented as shown in FIG. 4, in which only four sides xlo, ylo, xhi, and yhi for the corresponding octagon structure have non-zero lengths. Sides ahi, bhi, blo, and alo for the octagon structure for polygon 2201 have zero lengths. Similarly, rectangular-shaped polygon 2203 can also be represented in like manner, in which its corresponding octagon structure has sides xlo, ylo, xhi, and yhi with non-zero lengths, but having sides ahi, bhi, blo, and alo with zero lengths. Polygon 2205 has a triangular shape in which the corresponding octagon structure has non-zero lengths for the ahi, xhi, and ylo sides. Sides yhi, bhi, alo, blo, and xlo have zero lengths for this octagon structure.

Each structure can include one or more data elements to identify and track neighbors along edges of the polygon structure, such as a north neighbor, northeast neighbor, south neighbor, southeast neighbor, east neighbor, southwest neighbor, west neighbor, and northwest neighbor. Information about neighbors in an up or down direction, which may be located on another layer, can also be stored in the structure. This type of information can also be identified by a look-up method. Note that relationships between non-orthogonal/diagonal neighbors can therefore be maintained using the octagon structure of the present embodiment, e.g., for neighbors along northeast, southeast, northwest, and southwest edges.

Multiple octagons can be merged and tracked using a single octagon structure according to one embodiment of the invention. In one embodiment, multiple shapes can be merged so long as the number of sides on the combined shape does not exceed eight sides. Steps that are performed to implement the merge process are: (a) identifying the neighbor structures to be merged; (b) ensuring that the two structures share a common edge; (c) confirming that edges that will be summed and extended as a result of the merger between the neighboring structures properly align together; (d)confirming that the combined structure does not exceed eight sides; and (d) confirming that the merged structure has a convex shape. In addition, the process can perform a step to confirm that the combined shape does not have any illegal or unsupported angles.

When performing the merge operation, the eight bounds xlo, ylo, xhi, yhi, alo, blo, ahi, and bhi of the resulting merged shape define the parameters of the new structure. To illustrate, consider the objects to merge shown in FIG. 8. A first object is a triangular polygon 1102 which has non-zero lengths for $Xlo_{1102}$, $Yhi_{1102}$, and $Alo_{1102}$ and zero lengths for $Ahi_{1102}$, $Bhi_{1102}$, $Xhi_{1102}$, $Blo_{1102}$, and $Ylo_{1102}$. A second object is a five-sided polygon 1104 which has non-zero lengths for $Xlo_{1104}$, $Ahi_{1104}$, $Yhi_{1104}$, $Xhi_{1104}$, and $Ylo_{1104}$ and zero lengths for $Bhi_{1104}$, $Blo_{1104}$, and $Alo_{1104}$.

Figure 8:
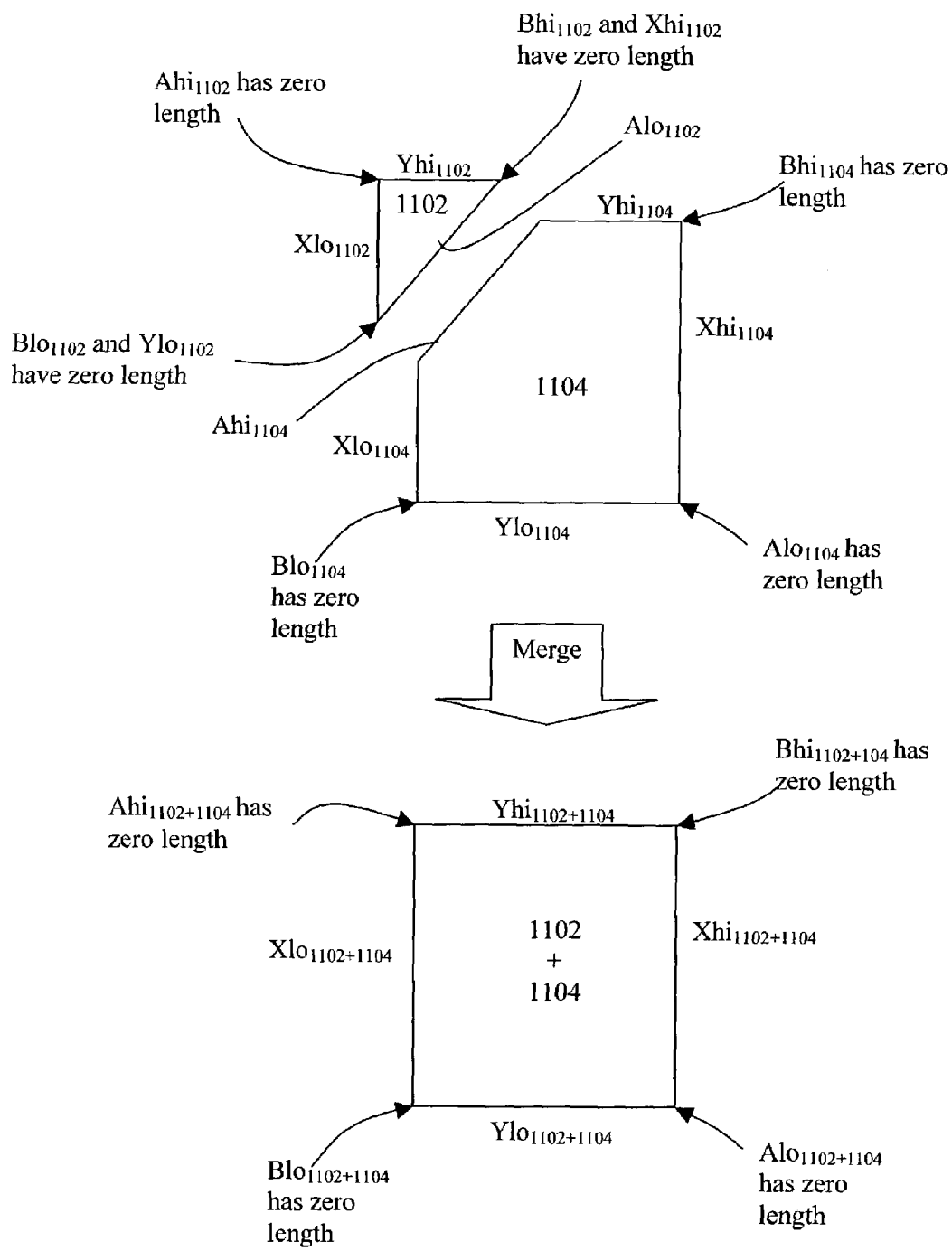
FIG. 8 shows an embodiment of an approach for merging multiple objects.

Assume that the two shapes share a common edge along $Alo_{1102}$ and $Ahi_{1104}$ and that the edges that will be summed and extended as a result of the merger between the neighboring structures are properly aligned (e.g., $Yhi_{1104}$ and $Yhi_{1102}$ will sum and extend together in the merged shape as will $Xlo_{1104}$ and $Xlo_{1102}$). As can be seen in FIG. 8, the combined shape is a convex shape and has a supported number of sides, i.e., the merged shape is a rectangular structure. Therefore, objects 1104 and 1102 are eligible to be merged together. The merged shape has non-zero lengths for $Xlo_{1102+1104}$, $Yhi_{1102+1104}$, $Xhi_{1102+1104}$, and $Ylo_{1102+1104}$ and zero lengths for $Bhi_{1102+1104}$, $Blo_{1102+1104}$, $Ahi_{1102+1104}$ and $Alo_{1102+1104}$.

When two objects merge together, it can be seen that existing edges for the separate structures may combine into larger length edges (or even smaller length edges, depending on the configuration of the merged shape), e.g., Yhi and Xlo for the combined object in FIG. 8 expand to include the lengths from both shapes. In addition, the merged shape may convert edges with existing lengths into zero-length bounds in the merged structure or vice-versa, e.g., $Ahi_{1104}$ and $Alo_{1102}$ in FIG. 8 has non-zero lengths, but the merged object has zero-length values $Ahi_{1102+1104}$ and $Alo_{1102+1104}$.

It is noted that the present octagon structure can be implemented using any suitable form of computer-usable or computer-readable article or medium. For example, the octagon structure can be implemented in one embodiment as a computer-implemented memory or storage system-based data structure.

Space Tiles

Another advantage provided by the present approach is that any space tile, including non-orthogonal or diagonal space tiles, can be tracked and represented using octagon-based structures. A set of space tiles is formed by tessellating an area within an IC design. A space tile corresponds to a plane figure in the tessellation. In one embodiment, the contours of some or all of the space tiles are derived from or are based upon the shapes of existing objects in the tessellated area. "Free" space tiles refer to space tiles which are presently unoccupied. "Used" space tiles refer to space tiles that are occupied by one or more objects. An example of a prior product that tessellates an area of a layout to identify free space tiles is the IC Craftsman layout automation product, available since at least 1998 from Cooper and Chyan Technology, now owned and distributed by Cadence Design Systems, Inc. of San Jose, Calif.

Identifying free space tiles provides an approach for determining available locations to route wires or place objects on a chip. Since the space tiles are not dependent upon the concept of a grid, space tiles allow gridless routing to be performed.

Figure 9A:
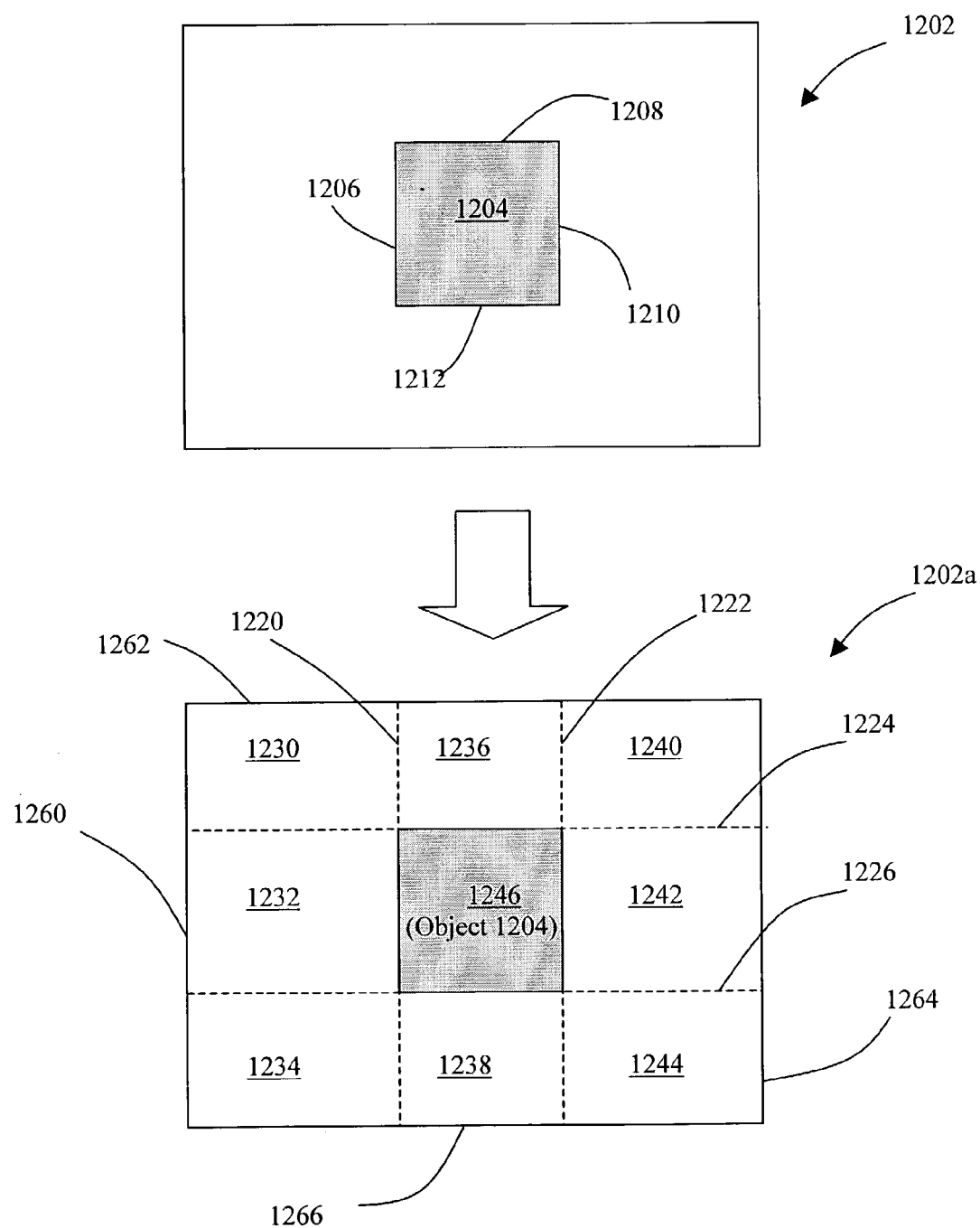
FIGS. 9*a*–*d* show example approaches for implementing space tiles.

Various approaches can be employed to form space tiles on a chip. In one embodiment, the space tiles are formed based upon or derived from the shapes of existing objects in the chip sections (although some or all of the space tiles can also be arbitrarily shaped). For example, one approach to forming space tiles having contours derived from existing shapes is to identify the edges of existing objects within a window, and extending those edges (e.g., using hyperplanes) to define boundary lines within the window. These boundary lines become the borders of spaces tiles within the window. FIG. 9a illustrates this approach for forming space tiles using the boundaries of existing shapes within a chip portion. In FIG. 9a, an existing shape/object 1204 is located in a window 1202. Object 1204 is shaped such that it includes a top edge 1208, bottom edge 1212, left edge 1206, and right edge 1210. Throughout this document, orientation-related terms such as "top", "bottom", "left", and "right" are used to provide a thorough explanation of the invention; it is noted that no intent is intended by these terms to limit the scope of the invention except as defined by the claims.

As shown in revised window 1202a, each of the edges 1206, 1208, 1210, and 1212 on object 1204 are extended in both directions until they reach the edge/boundary of the window 1202a or another object. These edge extensions form boundary lines in the window 1202a. Thus, edge 1206 is extended to form boundary line 1220. Similarly, edge 1208 is extended to form boundary line 1224, edge 1210 is extended to form boundary line 1222, and edge 1212 is extended to form boundary line 1226. If window 1202a contains additional shaped objects, this process repeats for each additional object in the window.

A space tile corresponds to each portion of window 1202a bounded by a set of boundary lines, or bounded by boundary lines and the edge of the window 1202a. Thus, space tile 1230 corresponds to the portion of window 1202a bounded by boundary line 1220, boundary line 1224, left window edge 1260, and top window edge 1262. Space tile 1232 corresponds to the portion of window 1202a bounded by boundary line 1224, boundary line 1220, boundary line 1226, and left window edge 1260. In a similar manner, space tiles 1234, 1236, 1238, 1240, 1242, and 1244 correspond to the various boundary lines and window edges shown for window 1202a. Note that each of these space tiles 1230–244 are vacant of any shapes or objects. Since these space tiles are presently empty, they are considered free space tiles eligible to receive additional objects or shapes.

Object 1204 is entirely bounded by boundary lines (boundary lines 1220, 1222, 1224, and 1226). The region bounded by these boundary lines itself forms a space tile 1246, which is entirely occupied by object 1204. Since space tile 1246 is completely filled by object 1204, it is considered a used space tile that is not eligible to receive any additional objects or shapes.

Placement and routing processes may be implemented by identifying free space tiles in a layout. For example, consider if it is desired to route one or more wires within window 1202 in FIG. 9a. As shown in revised window 1202a, the free space tiles in this window can be formed and identified. Sets of connected free space tiles can be identified that show available locations in the window to allow a contiguous routing path to extend in the desired routing direction. If the desired routing direction is between the left and right edges of window 1202, then a first routing path could be formed from the set of contiguous free space tiles 1230, 1236, and 1240 and a second routing path could be formed from the set of contiguous free space tiles 1234, 1238, and 1244. Similarly, if the desired routing direction is between the top and bottom edges of the window 1202, then a routing path could be formed from the set of contiguous free space tiles 1230, 1232, and 1234 or from the set of contiguous free space tiles 1240, 1242, and 1244. The data structure used to maintain a space tile, e.g., the octagon structure described herein, can include one or more data elements identifying its neighboring space tiles. This neighbor information is used to facilitate identification of adjacent free space tiles in the routing paths through the layout.

The dimensions of the space tiles can be adjusted to allow compliance with design and manufacturing rules. Since one reason for identifying free space tiles is to identify regions of the chip that are available to locate additional objects, the dimensions of the space tiles may be adjusted to ensure that placing an object in the free space tile will not create a conflict, e.g., a design rule checking ("DRC") violation, with other existing objects on the layout.

Figure 9B:
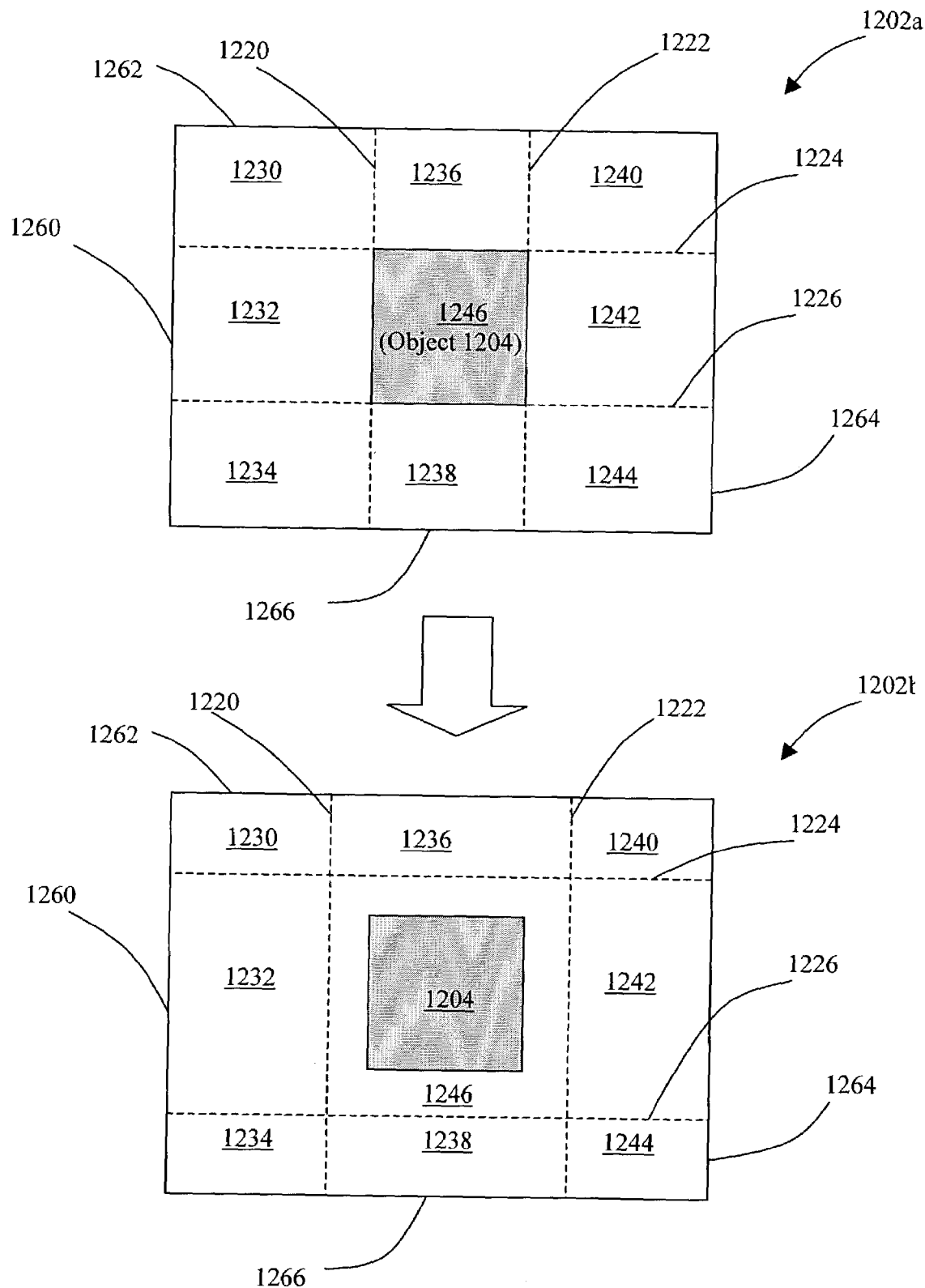

Referring to FIG. 9b, shown is the window 1202a containing the free space tiles 1230, 1232, 1234, 1236, 1238, 1240, 1242, and 1242 that were created surrounding object 1204 and its corresponding used space tile 1246 in FIG. 9a. Without taking design rules into account, each of the free space tiles 1230–244 directly abut the used space tile 1246, since the only consideration taken to this point to form the free space tiles has been to identify the exact exterior dimensions of the object 1204.

To comply with design rules, a fence can be created around object 1204 that identifies a surrounding distance in which other objects cannot be placed. Thus, boundary lines 1220, 1222, 1224, and 1226 are shifted by a given clearance distance away from the edges of object 1204, as shown in window 1202b. As before, the boundary lines form the boundaries of the resultant space tiles in the window 1202b. Thus, it can be seen that used space tile 1246 now includes a fence around object 1204 that is not actually occupied, but is considered "used" to prevent other objects from being placed within that region in a way that would violate design or manufacturing rules.

In one embodiment, the boundary lines are used to show the permissible boundaries of locations for the centerline of objects (e.g., wires) that can be placed at or through the free space tiles. Thus, the boundary lines actually form a "clearance shadow" that is the clearance distance plus half the width of the object that is to be moved or added. In other words, the boundaries of the free space tiles are identified such that an object can be permissively moved with its centerline overlaid on the free space tile boundary without causing a conflict with an existing object.

Figure 9C:
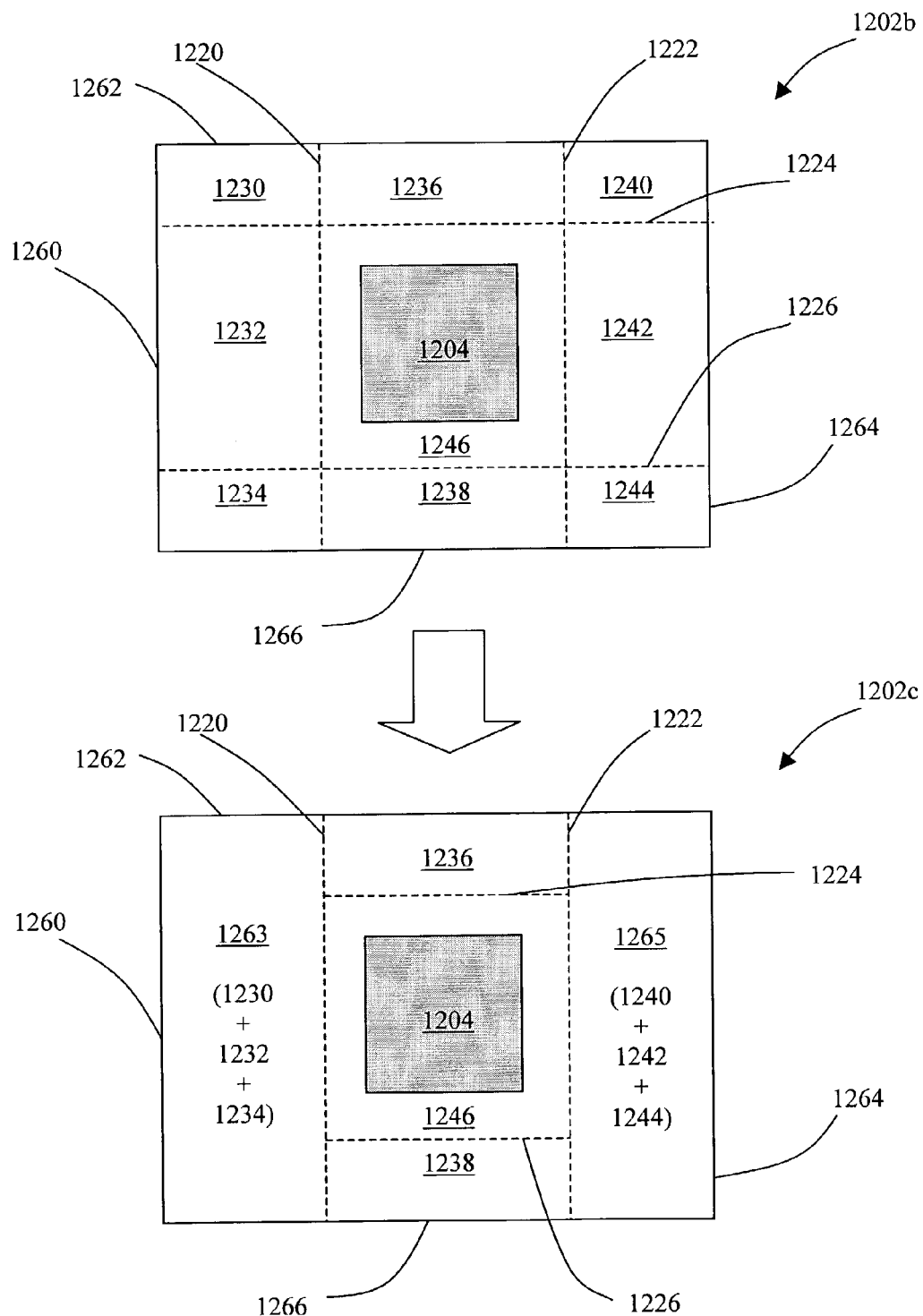

Once the free space tiles have been established, some or all of the free space tiles can be combined into larger free space tiles. Referring to FIG. 9c, it can be seen that free space tiles 1230, 1232, and 124 have been combined into a single large free space tile 1263 along the left portion of the window 1202c. Similarly, free space tiles 1240, 1242, and 1244 have been combined into a single large free space tile 1265 along the right portion of window 1202b. The merge process described with reference to FIG. 8 can be used to implement this merging of space tiles.

Alternatively, these larger free spaces 1263 and 1265 are initially created when the free space tiles are identified, such that the breakup of space in the area of window 1202 is not symmetric. This allows the tiles in one area (i.e., free space tiles 1263 or 1265) to extend all the way to the edges of the used space tile 1246, but tiles in other areas do not, i.e., free space tiles 1236 and 1238. In one embodiment, this is considered "preferred vertical" fracturing that can be used on a layer with preferred vertical routing. In an embodiment, the preferred fracturing direction of each layer is controllable and optional.

The process of tessellating a chip portion or area into space tiles can also be referred to as space tile "punch." During the punch process, identification is made of all the shapes that affect the area and which affect the formation of space tiles. In one approach, punching a shape leaves a hole in the tile area where the shape being punched is located. Alternatively, the used space tiles can be left behind.

Figure 9D:
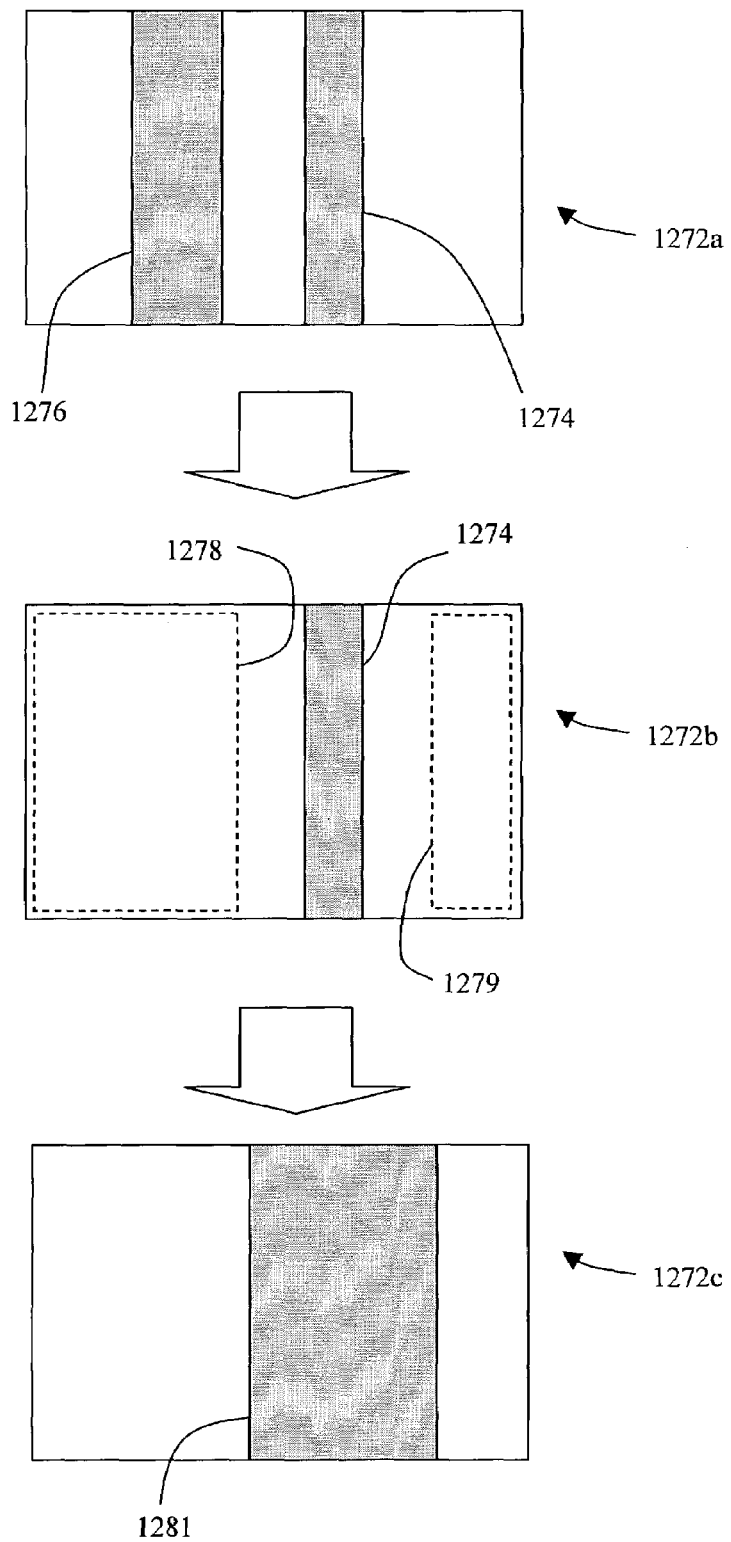

When performing a punch against an object, this action identifies free space tiles against a version of the window in which the object does not appear since the object is possibly being moved. Referring to FIG. 9d, shown is a window 1272a containing wire segment 1276 and wire segment 1274. Consider if it is desired to perform a space tile punch against wire 1276, i.e., to determine the free space tiles in window 1272a with respect to wire 1276.

Revised window 1272b shows the result of performing a space tile punch against wire 1276. As previously noted, the space tile punch operation determines the free space tiles after the subject object has been removed from consideration. After removing wire 1276, only wire 1274 remains as a show in window 1272b. Thus, the free space tiles are identified based upon the contours of wire 1274. Here, the result of the space tile punch is a first free space tile 1278 along the left edge of the window 1272b and a second free space tile 1279 along the right edge of window 1272b. Note that these free space tiles do not extend directly against the remaining wire 1274. For the purposes of performing the punch operation, wire 1274 is considered an obstruction, and the free space tiles are adjusted to ensure compliance with distance requirements for the design rules. Thus, the boundaries of free space tiles 1278 and 1279 are adjusted away from wire 1274 to a clearance distance corresponding to DRC correctness requirements. Thus, free space tiles 1278 and 1279 now identify the boundaries (with respect to the centerline of wire 1276) of the locations/paths at which wire 1276 can be permissively moved within window 1272b. Revised window 1272c shows an inverted view in which the entire region that is considered unavailable is shown as a used space tile 1281. It is noted that using boundary lines as shown in FIGS. 9a–d provides just one approach to forming space tiles; space tiles can also be formed from and using arbitrary shapes.

With respect to space tiles having non-orthogonal shapes, consider if it is desired to form space tiles within window 2200 of FIG. 7. This can be accomplished, for example, by extending each edge of the existing shapes in the window to form boundary lines, which form the borders of the space tiles. In this example, polygon 2201 has edges 2201-1, 2201-2, and 2201-3. Polygon 2203 has edges 2203-1, 2203-2, and 2203-3. Polygon 2205 has edges 2205-1 and 2205-2.

Figure 10:
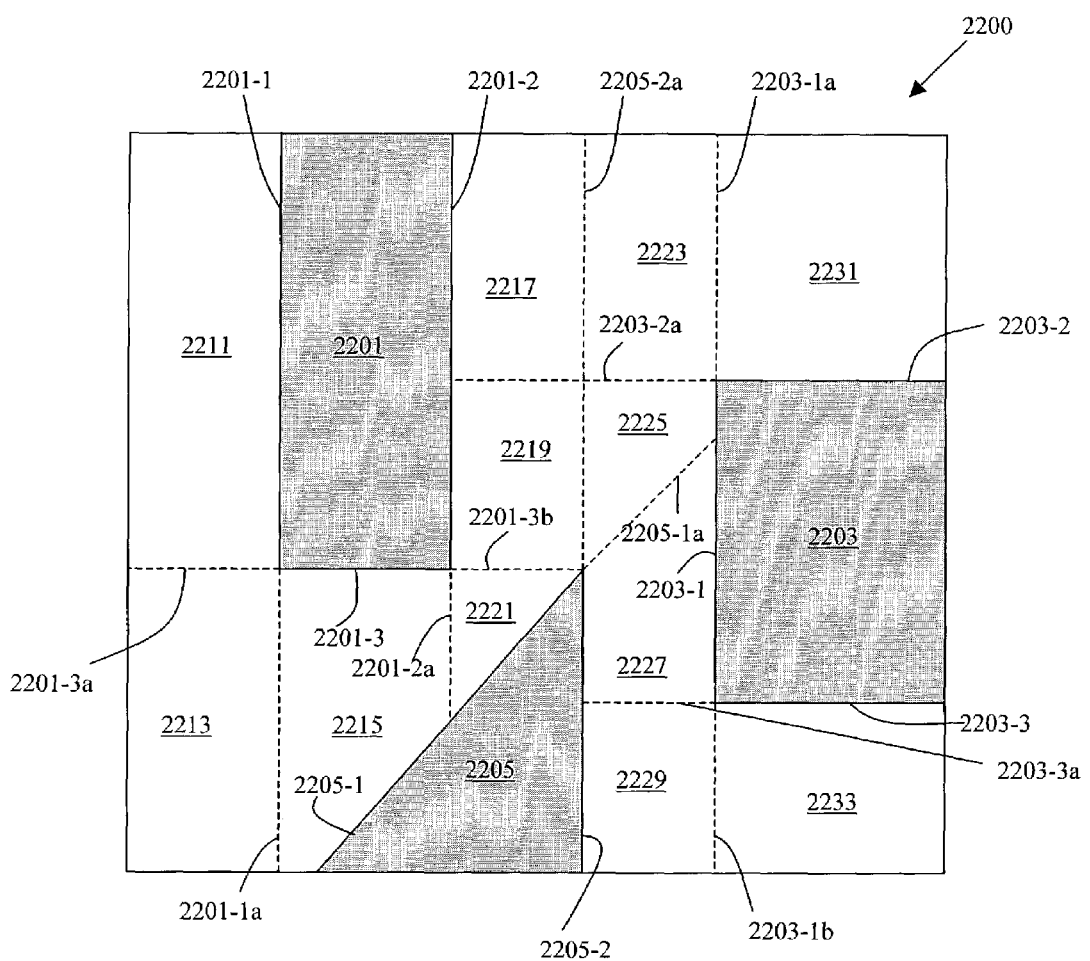
FIG. 10 illustrates an approach for forming non-orthogonal space tiles according to an embodiment of the invention.

With reference to FIG. 10, the edges of the polygons are extended to form boundary lines. Thus, edge 2201-1 is extended to form boundary line 2201a. Edge 2201-2 is extended to form boundary line 2201-2a. Similarly, edges 2201-3, 2203-1, 2203-2, 2203-3, 2205-1, and 2205-2 are extended to form boundary lines 2201-3a and 2201-3b, 2203-1a and 2203-1b, 2203-2a, 2203-3a, 2205-1a, and 2205-2a, respectively.

A space tile is formed in this example by a set of boundary lines, window edge, or polygon edge. Thus, space tile 2211 is formed by the boundary line 2201-3a, the left edge of polygon 2201, and the top and left edges of the window 2200. Space tile 2213 is formed by boundary lines 2201-3a, 2201-1a, and the bottom and left edges of the window 2200. In a similar manner, space tiles 2215, 2217, 2219, 2221, 2223, 2225, 2227, 2229, 2231, and 2233 are formed by combinations of sets of boundary lines, polygon edges, and window edges. Since these space tiles are presently empty, they are considered free space tiles eligible to receive additional objects or shapes.

Polygon 2201 is entirely bounded by boundary lines 2201-1, 2201-2, 2201-3, and the top window edge. The region bounded by these boundary lines itself forms a space, which is entirely occupied by polygon 2201. Since this space tile is completely filled by polygon 2201, it is considered a used space tile that is not eligible to receive any additional objects or shapes. Similarly, polygons 2203 and 2205 completely occupy used space tiles formed from their respective boundary lines and edges.

Each space tile can be represented using the disclosed octagon data structure. Thus, rectangular space tiles 2211, 2213, 2217, 2219, 2223, 2229, 2231, and 2233 could be represented as degenerate octagons using the octagon structure as shown in FIG. 4.

Note that non-orthogonal space tiles are formed in window 2200. In particular, some of the space tiles include diagonal sides as well as orthogonal sides. For instance, free space tiles 2215, 2221, 2225 and 2227 are formed having diagonal sides. Space tile 2215 has an irregular pentagon shape that is represented using the octagon structure in which sides xlo, yhi, xhi, alo, and ylo have non-zero lengths, but sides ahi, bhi, and blo have zero lengths. Space tile 2221 has a triangular structure in which sides xlo, yhi, and alo have non-zero lengths but sides yhi, bhi, xhi, ylo, and blo have zero lengths. Space tile 2225 has a shape in which xlo, yhi, xhi, and alo have non-zero lengths but sides ahi, bhi, ylo, and blo have zero lengths. Space tile 2227 has a shape in which xlo, ahi, xhi, ylo has non-zero lengths and sides yhi, bhi, alo, and blo have zero lengths.

The non-orthogonal space tiles can be used to define non-orthogonal routing paths. As noted above, a free space tile is a location in the layout that has been identified as being free of objects, and therefore is available if it is desired to route wires through that free location. Multiple adjacent free space tiles can be identified to form a routing path for wires. As described above, each structure can contain data elements to identify neighboring objects and structures. One advantage provided by storing neighbor information, such as neighbor information for "free space tiles", is that this information allows identification of adjacent space tiles, which can be used to find navigation and routing paths in the layout. Consequently, since the present structure to track polygons can store neighbor information in non-orthogonal/diagonal directions, this facilitates identification of navigation and routing paths in non-orthogonal/diagonal directions. For example, in FIG. 10. it can be seen that a diagonal routing path can be formed for the path defined by free space tiles 2215, 2221, and 2219.

Figure 11:
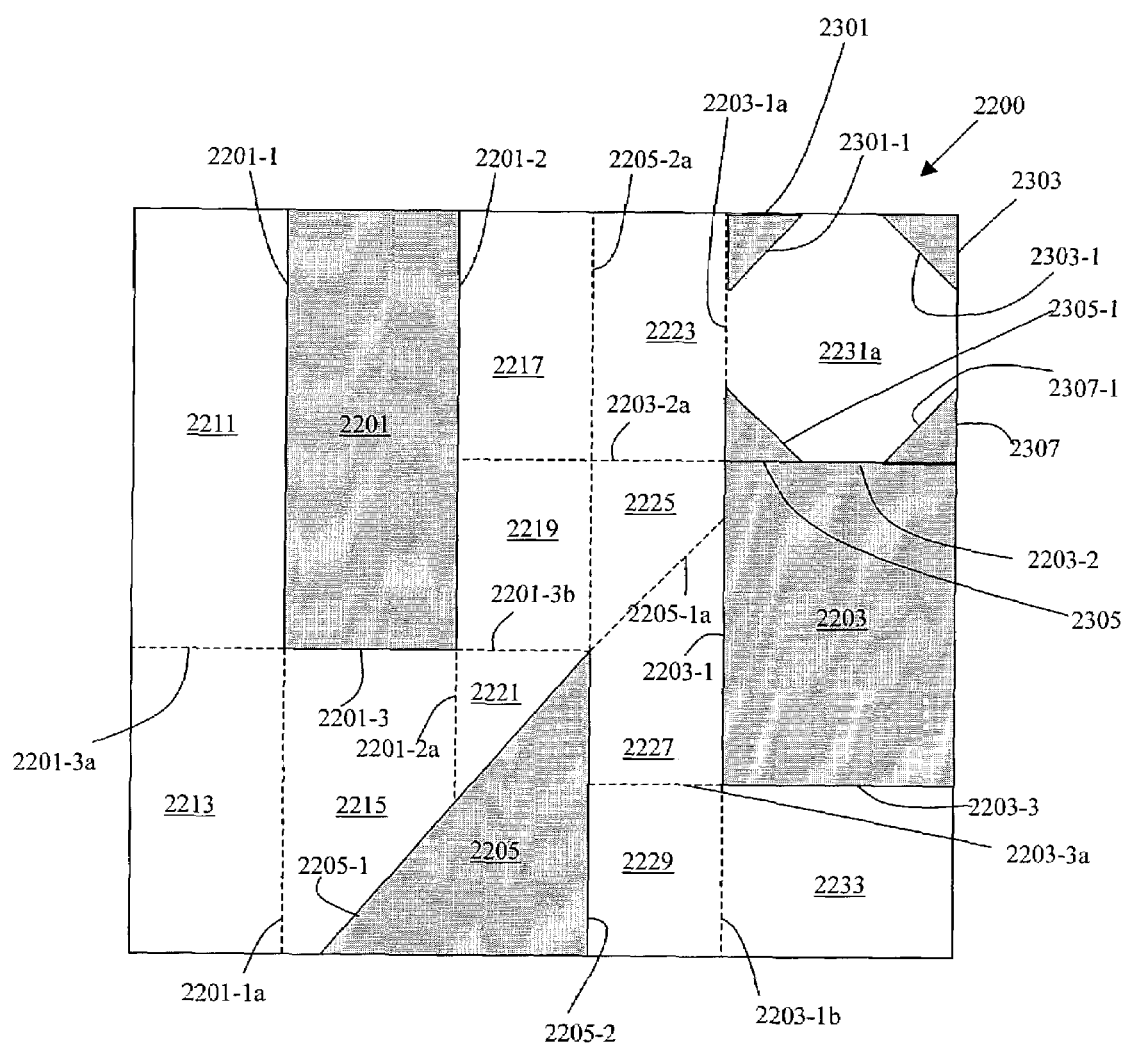
FIG. 11 illustrates an approach for forming non-orthogonal space tiles according to an embodiment of the invention.

FIG. 11 shows an alternate version of the window of FIG. 10 containing additional objects 2301, 2303, 2305, and 2307. In this alternate version, it can be seen that the free space tile 2231*a* is a true octagonal shape defined by the boundary lines 2203-1*a*, 2203-2, the upper and right edges of the window, and edges 2301-1, 2303-1, 2305-1, and 2307-1. Thus, the octagon-based structure for free space tile 2231*a* has non-zero length values for all eight xlo, ylo, xhi, yhi, alo, blo, ahi, and bhi.

Therefore, what has been described in a method, mechanism, and data structure for implementing a layout for an integrated circuit. An octagonal structure can be used to store and track all polygons on the layout. In addition, the same structure can be used to form, store, and track diagonal and non-orthogonal space tiles on the layout. The present invention may be embodied as any combination of software, hardware, or manually-implemented operations or structures. In one specific embodiment, the invention is embodied as data structures used by a EDA software tool for placing and/or routing integrated circuit designs.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the exact ordering or content of the described process actions may be changed without affecting the scope or operation of the invention. The specification and drawings are, accordingly, to be regarded in an illustrative rather than restrictive sense.

What is claimed is:

1. A method for implementing a layout of an integrated circuit, comprising:
   identifying one or more objects to be placed on an integrated circuit layout;
   tracking each of the one or more objects using an octagon-based structure, the octagon-based structure maintains at least eight data values, with the at least eight data values corresponding to sides of an octagon shape, the at least eight data values identify locations of corresponding sides along a perpendicular axis to the sides, and
   in which at least one of the at least eight data values corresponds to a zero length side, in which the octagon shape is a degenerate octagon having less than eight sides.

2. A method for implementing a layout of an integrated circuit, comprising:
   identifying one or more objects to be placed on an integrated circuit layout;
   tracking each of the one or more objects using an octagon-based structure in which the octagon-based structure comprises one or more data elements to identify neighboring objects with respect to the one or more objects.

3. The method of claim 2 in which neighboring objects are tracked along each edge of the octagon-based structure.

4. The method of claim 3 in which relational information is maintained for a non-orthogonal edge between one of the one or more objects and its neighboring object.

5. The method of claim 3 further comprising:
   identifying a routing path based upon tracking neighboring objects.

6. The method of claim 5 in which the neighboring objects are free space tiles.

7. The method of claim 5 in which the routing path is a non-orthogonal routing path.

8. A method for implementing a layout of an integrated circuit, comprising:
   identifying one or more objects to be placed on an integrated circuit layout;
   tracking each of the one or more objects using an octagon-based structure in which at least two objects are merged together into a single shape, wherein a single octagon-based structure is used to track the single shape.

9. The method of claim 8 further comprising:
   identifying the at least two objects to merge;
   confirming that the at least two objects share a common edge;
   verifying that edges to sum together in the single shape are properly aligned;
   verifying that the single shape has a supported number of sides; and
   confirming that the single shape is convex.

10. The method of claims 1, 2 or 8 in which the one or more objects comprise a space tile that is based upon a contour of an existing shape in the layout.

11. The method of claims 1, 2 or 8 in which at least one of the one or more objects has less than eight sides.

12. The method of claim 2 in which the octagon-based structure maintains at least eight data values, with the at least eight data values corresponding to sides of an octagon shape.

13. The method of claim 8 in which the octagon-based structure maintains at least eight data values, with the at least eight data values corresponding to sides of an octagon shape.

14. The method of claim 1, 12 or 13 in which the at least eight data values identify angle information for at least one of the sides of the octagon shape.

15. The method of claim 14 in which the angle information is implicit based upon a default angle value.

16. A computer program product comprising a computer usable medium having executable code to execute a process for implementing a layout of an integrated circuit, the process comprising:
   identifying one or more objects to be placed on an integrated circuit layout;
   tracking each of the one or more objects using an octagon-based structure, the octagon-based structure maintains at least eight data values, with the at least eight data values corresponding to sides of an octagon shape, the at least eight data values identify locations of corresponding sides along a perpendicular axis to the sides, and in which at least one of the at least eight data values corresponds to a zero length side, in which the octagon shape is a degenerate octagon having less than eight sides.

17. The computer program product of claim 16 in which the at least eight data values identify angle information for at least one of the sides of the octagon shape.

18. A system for implementing a layout of an integrated circuit, comprising:
   means for identifying one or more objects to be placed on an integrated circuit layout;

means for tracking each of the one or more objects using an octagon-based structure, the octagon-based structure maintains at least eight data values, with the at least eight data values corresponding to sides of an octagon shape, the at least eight data values identify locations of corresponding sides along a perpendicular axis to the sides, and in which at least one of the at least eight data values corresponds to a zero length side, in which the octagon shape is a degenerate octagon having less than eight sides.

19. The system of claim 18 in which the at least eight data values identify angle information for at least one of the sides of the octagon shape.

20. A computer program product comprising a computer usable medium having executable code to execute a process for implementing a layout of an integrated circuit, the process comprising:
   identifying one or more objects to be placed on an integrated circuit layout;
   tracking each of the one or more objects using an octagon-based structure, in which the octagon-based structure comprises one or more data elements to identify neighboring objects with respect to the one or more objects.

21. The computer program product of claim 20 in which neighboring objects are tracked along each edge of the octagon-based structure.

22. A system for implementing a layout of an integrated circuit, comprising:
   means for identifying one or more objects to be placed on an integrated circuit layout;
   means for tracking each of the one or more objects using an octagon-based structure, in which the octagon-based structure comprises one or more data elements to identify neighboring objects with respect to the one or more objects.

23. The system of claim 22 in which neighboring objects are tracked along each edge of the octagon-based structure.

24. A computer program product comprising a computer usable medium having executable code to execute a process for implementing a layout of an integrated circuit, the process comprising:
   identifying one or more objects to be placed on an integrated circuit layout;
   tracking each of the one or more objects using an octagon-based structure, in which at least two objects are merged together into a single shape, wherein a single octagon-based structure is used to track the single shape.

25. The computer program product of claims 16, 20 or 24 in which the one or more objects comprise a space tile that is based upon a contour of an existing shape in the layout.

26. The computer program product of claims 16, 20 or 24 in which at least one of the one or more objects has less than eight sides.

27. The computer program product of claim 24, wherein the process further comprising:
   identifying the at least two objects to merge;
   confirming that the at least two objects share a common edge;
   verifying that edges to sum together in the single shape are properly aligned;
   verifying that the single shape has a supported number of sides; and
   confirming that the single shape is convex.

28. A system for implementing a layout of an integrated circuit, comprising:
   means for identifying one or more objects to be placed on an integrated circuit layout;
   means for tracking each of the one or more objects using an octagon-based structure, in which at least two objects are merged together into a single shape, wherein a single octagon-based structure is used to track the single shape.

29. The system of claims 18, 22 or 28 in which the one or more objects comprise a space tile that is based upon a contour of an existing shape in the layout.

30. The system of claims 18, 22 or 28 in which at least one of the one or more objects has less than eight sides.

31. The system of claim 28 further comprising:
   means for identifying the at least two objects to merge;
   means for confirming that the at least two objects share a common edge;
   means for verifying that edges to sum together in the single shape are properly aligned;
   means for verifying that the single shape has a supported number of sides; and
   means for confirming that the single shape is convex.

* * * * *